US007570508B2

(12) United States Patent
Seifert et al.

(10) Patent No.: US 7,570,508 B2
(45) Date of Patent: Aug. 4, 2009

(54) METHOD AND APPARATUS FOR REDUCING SOFT ERRORS

(75) Inventors: Norbert R. Seifert, Newton, MA (US); Xiaowei Zhu, Richardson, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1242 days.

(21) Appl. No.: 10/743,165

(22) Filed: Dec. 22, 2003

(65) Prior Publication Data

US 2005/0138482 A1    Jun. 23, 2005

(51) Int. Cl.
    *G11C 11/00* (2006.01)
(52) U.S. Cl. ............... 365/154; 327/198; 327/217; 365/206
(58) Field of Classification Search ........... 327/199, 327/200, 208, 210, 211, 215, 219, 218, 198, 327/217; 365/154, 206
    See application file for complete search history.

(56) References Cited

U.S. PATENT DOCUMENTS

| 4,910,713 | A | * | 3/1990 | Madden et al. ........ 365/189.11 |
| 5,504,703 | A | * | 4/1996 | Bansal ................... 365/156 |
| 6,026,011 | A | * | 2/2000 | Zhang .................... 365/154 |
| 6,201,418 | B1 |  | 3/2001 | Allmon |
| 6,222,404 | B1 | * | 4/2001 | Mehta et al. ............ 327/200 |
| 6,288,932 | B1 |  | 9/2001 | Samala |
| 6,367,025 | B1 | * | 4/2002 | Bailey ................... 713/400 |
| 6,369,630 | B1 |  | 4/2002 | Rockett |
| 6,400,186 | B1 | * | 6/2002 | Bailey et al. ............ 327/55 |
| 2003/0122602 | A1 |  | 7/2003 | Ta et al. |

FOREIGN PATENT DOCUMENTS

| EP | 1289146 A | 3/2003 |
| JP | 61-162895 A | 7/1986 |
| JP | 09-312098 A | 12/1997 |
| JP | 2001-23376 A | 1/2001 |

OTHER PUBLICATIONS

R. Ramanarayanan et al., "Analysis of Soft Error Rate in Flip-Flops and Scannable Latches," Microsystems Design Laboratory, 4 pp.
K. Mohanram et al. "Cost-Effective Approach for Reducing Soft Error Failure Rate in Logic Circuits," University of Texas at Austin, 9 pp.
English Abstract for JP 61-162895 A.
English Abstract for JP 09-312098 A.
English Abstract for JP 2001-23376 A.

* cited by examiner

*Primary Examiner*—Van Thu Nguyen
*Assistant Examiner*—Alexander Sofocleous

(57) ABSTRACT

A method and apparatus for reducing soft errors in which the method includes: assigning a plurality of nodes within a storage circuit to a predetermined state; evaluating a plurality of signals coupled to the storage circuit, where evaluating the plurality of signals enables a first node to change from its predetermined state; and actively maintaining a second node in its predetermined state, where actively maintaining the predetermined state reduces the storage circuit's susceptibility to soft errors.

10 Claims, 2 Drawing Sheets

US 7,570,508 B2

METHOD AND APPARATUS FOR REDUCING SOFT ERRORS

BACKGROUND

Most users of electronic devices are familiar with glitches—i.e., random, non-catastrophic events which do not destroy the electronic devices. The term "soft error" refers to a glitch in a semiconductor device, such as integrated circuit, which affects the data contained in the semiconductor device. In general, soft errors may be caused when ionizing radiation (e.g., neutrons, alpha-particles, and electromagnetic radiation) interacts with the atoms of the semiconductor compounds that semiconductor devices are composed of. Specifically, the interaction of semiconductors with ionizing radiation results in the generation of charged particles in the semiconductor material. These charged particles are sometimes referred to as electron-hole pairs. The electron-hole pairs may be collected by nodes in the circuit that are particularly susceptible to the injection of electron-hole pairs. For example, integrated circuit memory elements may change from 1 to a 0 or vice versa due to the injection of electron-hole pairs. The ionizing radiation may come from radioactive materials and/or cosmic rays. For example, high-energy cosmic rays and solar particles may react with the earth's upper atmosphere to generate high-energy protons that shower to the earth's surface and affect semiconductor devices. Another known source of soft errors is alpha particles—i.e., particles emitted by trace amounts of radioactive isotopes—present in the packaging materials of integrated circuits. For example, flip-chip packaging technology utilizes lead bumps, which have been identified as containing alpha particles. In addition, as semiconductor devices are built smaller and smaller, the current rates at which soft errors occur may become unacceptable.

BRIEF SUMMARY

A method and apparatus for reducing soft errors is disclosed. In some embodiments the method comprises: assigning a plurality of nodes within a storage circuit to a predetermined state; evaluating a plurality of signals coupled to the storage circuit, where evaluating the plurality of signals enables a first node to change from its predetermined state and enables a second node to be more susceptible to perturbations; and maintaining the second node in its predetermined state for a predetermined period of time, where maintaining the predetermined state reduces the storage circuit's susceptibility to soft errors.

BRIEF DESCRIPTION OF THE DRAWINGS

For a detailed description of embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection, or through an indirect electrical connection via other devices and connections. The term "charge event" refers to ionizing radiation (e.g., neutrons or alpha particles) perturbing various nodes within a circuit. The terms "active pull-up" and "active pull-down" refer to the techniques used to directly assign high and low voltage values, respectively, to a node using a deliberate conduction path. For example, a node may be coupled to either $V_{dd}$ or ground via a transistor such that turning the transistor on may actively, as opposed to passively, pull the node up or down by providing a deliberate conduction path to $V_{dd}$ or ground.

DETAILED DESCRIPTION

Figure 1:
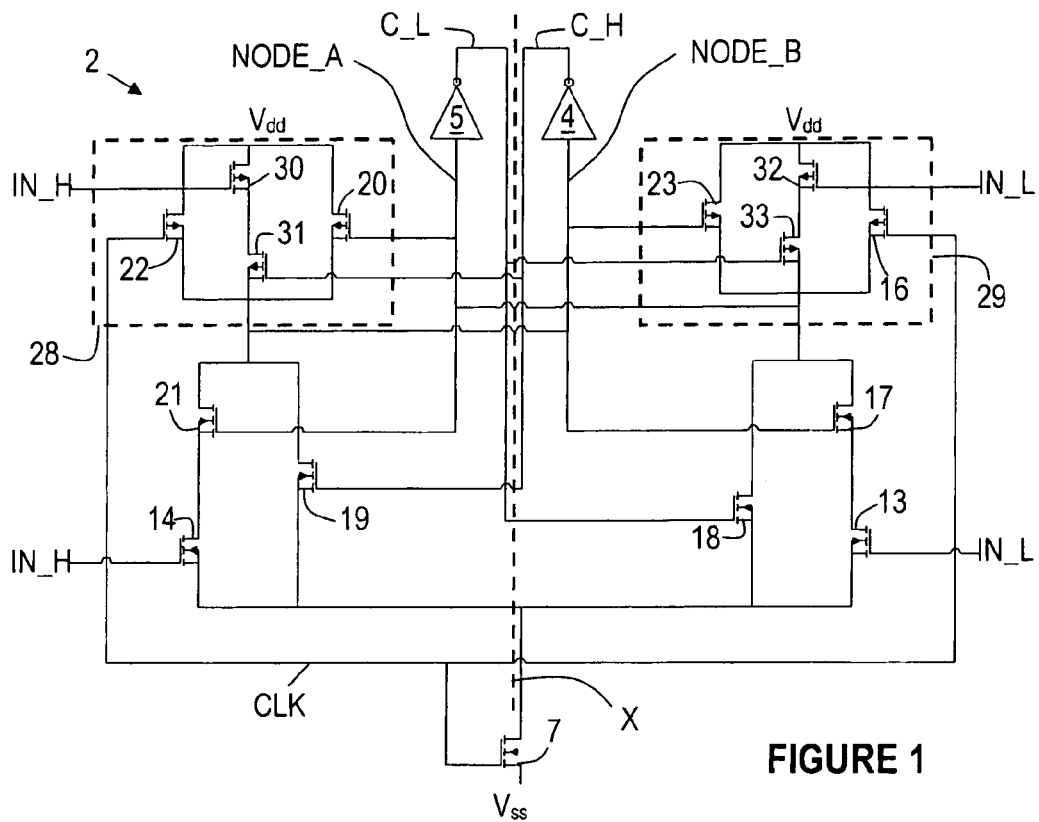
FIG. 1 illustrates a circuit configuration according to embodiments of the invention.

FIG. 1 shows a circuit configuration 2 according to embodiments of the invention. The circuit configuration operates between a positive power supply, $V_{dd}$, and a negative power supply, $V_{ss}$. In some embodiments, $V_{dd}$ is a voltage approximately less than 2 volts, and $V_{ss}$ is a voltage approximately equal to 0 volts. Trends in the semiconductor industry include manufacturing smaller transistors that operate at lower voltages. However, as operating voltages and transistor dimensions are reduced, the circuit built using such transistors becomes more susceptible to the ill effects of radiation discussed above. As integrated circuits implement techniques that reduce their susceptibility to the effects of radiation are desired Circuit 2 depicts a memory structure capable of retaining data. Circuit 2 comprises complementary outputs C_L and C_H. As an aid in understanding the operation of circuit 2, it may be helpful to observe the symmetry about line X where the devices on the left side of line X have a symmetrical counterpart on the right side of line X. The outputs C_L and C_H are provided by symmetrical inverters 4 and 5, where NODE_A and NODE_B further provide inputs for these inverters. With inverters 4 and 5 configured in this manner, outputs C_L and C_H produce the opposite values present at NODE_A and NODE_B respectively. (While discussing the operation of circuit 2, this disclosure focuses on NODE_A and NODE_B and refers to outputs C_L and C_H when necessary.) NODE_A and NODE_B attain two distinct states—i.e., $V_{dd}$ and $V_{ss}$. A tail current transistor 7 couples its source connection to $V_{ss}$ and provides the connection to $V_{ss}$ for all transistors in the system. The gate connection of transistor 7 couples to a clock line CLK, described in more detail below. As illustrated, transistor 7 is an N-type complementary metal oxide semiconductor ("CMOS") device. In this manner, applying a high voltage, i.e., $V_{dd}$, to the gate causes the transistor 7 to conduct current or be "ON." Likewise, if transistor 7 is an N-type CMOS device as illustrated, then applying a low voltage, i.e., $V_{ss}$, to the gate causes the transistor to not conduct current or be "OFF."

The drain connection of transistor 7 couples to the source connection of two symmetrical N-type CMOS transistors 13 and 14. In this manner, transistors 13 and 14 form a differential input pair, and their gates couple to complementary signals IN_H and IN_L as illustrated. For example, if $V_{dd}$ is applied to the gate of transistor 13 and $V_{ss}$ is applied to the gate of transistor 14, then, transistor 13 is ON and transistor 14 is OFF. With transistor 13 ON, other transistors and circuit nodes that are coupled to it may obtain a voltage of $V_{ss}$. Similarly, $V_{dd}$ may be applied to transistor 14 while $V_{ss}$ is applied to transistor 13 such that transistor 13 is OFF and transistor 14 is ON. Thus, with transistor 14 ON, other transistors and circuit nodes that are coupled to it may obtain a voltage of $V_{ss}$.

As illustrated in FIG. 1, transistor 13 couples to NODE_A through transistor 17, where the source of transistor 17 is coupled to transistor 13 and the drain of transistor 17 is coupled to NODE_A. (Note that transistor 17 is illustrated as an N-type CMOS device.) In addition, the gate of transistor 17 couples to NODE_B as illustrated. Accordingly, if NODE_B is set to a voltage of $V_{dd}$, then transistor 17 is ON and couples NODE_A to transistor 13. Similarly, transistor 14 couples to NODE_B through transistor 21 (which also is an N-type CMOS device), where the source of transistor 21 couples to transistor 14 and the drain of transistor 21 couples to NODE_B. As illustrated, the gate of transistor 21 couples to NODE_A. Thus, if NODE_A is set to a voltage of $V_{dd}$, then transistor 21 is ON and couples NODE_B to transistor 14. With transistors 13 and 17 and transistors 14 and 21 configured in this manner, NODE_A and NODE_B may attain a value of $V_{ss}$. For example, when IN_L is equal to $V_{dd}$ and NODE_B is equal to $V_{dd}$, transistors 13 and 17 are ON, and assuming CLK is equal to $V_{dd}$ (i.e., the "evaluate" phase discussed below), then the drain of transistor 17, or NODE_A, obtains a value of $V_{ss}$ via the transistor 17, 13, 7 path to $V_{ss}$. In addition, NODE_B obtains a value of $V_{dd}$ as explained below. Alternatively, when IN_H is equal to $V_{dd}$, NODE_A is equal to $V_{dd}$, and CLK is equal to $V_{dd}$, then the drain of transistor 21, or NODE_B, obtains a value of $V_{ss}$ via the transistor 21, 14, 7 path, whereas NODE_A obtains a value of $V_{dd}$ as explained below.

Other than obtaining a voltage value of $V_{ss}$ via the paths described above, NODE_A and NODE_B may alternatively achieve a voltage value of $V_{ss}$ using "keeper" transistors 18 and 19, both of which are illustrated as N-type CMOS devices. Transistors 18 and 19 are termed "keeper" transistors because they help circuit 2 sustain or keep its value once reached by providing an alternative path of conduction. For example, if the gate of transistor 19 (output C_H) couples to $V_{dd}$ such that transistor 19 is ON, and if CLK is equal to $V_{dd}$, then the combination of transistors 19 and 7 couple NODE_B, or the drain of transistor 19 to $V_{ss}$. Likewise, if the gate connection of transistor 18 (output C_L) couples to $V_{dd}$ and CLK is equal to $V_{dd}$, then transistors 18 and 7 provide a path for NODE_A, or the drain of transistor 18, to $V_{ss}$.

In addition to obtaining voltage values equal to $V_{ss}$, NODE_A and NODE_B may also obtain voltage values equal to $V_{dd}$. Transistors 20, 22, 30, and 31 (illustrated as P-type CMOS devices), comprise a group 28 of transistors that provide multiple paths for NODE_B to obtain a voltage value of $V_{dd}$. Note that P-type devices operate in a manner complimentary to N-type devices, and in general, presenting a high voltage at their gate terminal causes a P-type device to be OFF, whereas presenting a low voltage at their gate terminal causes a P-type device to be ON. Similar to group 28, transistors 16, 23, 32, and 33 (also illustrated as P-type CMOS devices), comprise a group 29 that provide multiple paths for NODE_A to obtain a voltage value of $V_{dd}$.

Referring to group 28, NODE_B couples to the drain terminals of transistors 20, 22, and 31, and $V_{dd}$ couples to the source terminals of transistors 20, 22, and 30. Therefore, if the gate of transistor 20 is equal to a low voltage, i.e., $V_{ss}$, then transistor 20 provides a path for NODE_B to obtain a voltage value of $V_{dd}$. With the gate of transistor 22 controlled by the clock signal CLK (discussed in more detail below), transistor 22 also provides a path for NODE_B to $V_{dd}$. For example, if CLK is equal to $V_{ss}$ (i.e., the "pre-charge" phase discussed below), then NODE_B obtains a voltage value equal to $V_{dd}$ through transistor 22. With respect to transistors 30 and 31, the drain of transistor 31 couples to NODE_B, the source of transistor 31 couples to the drain of transistor 30, and the source of transistor 30 couples to $V_{dd}$. Also, the gate of transistor 31 couples to C_H, while the gate of transistor 30 couples to IN_H. In this manner, transistors 30 and 31 also provide a path for NODE_B to obtain a voltage value equal to $V_{dd}$ (which may aid in the reduction of soft errors as described below). For example, if C_H (i.e., the inverse of NODE_B) is equal to $V_{ss}$, and IN_H is equal to $V_{ss}$, then transistors 30 and 31 provide a path for NODE_B to obtain a voltage value of $V_{dd}$. Akin to group 28, group 29 provides similar functionality for NODE_B enabling it to obtain voltage values equal to $V_{dd}$ via transistor 16, transistor 23, or the combination of transistors 32 and 33. Therefore, NODE_A and NODE_B may obtain voltage values equal to $V_{dd}$ and $V_{ss}$, and as a result, the outputs C_H and C_L also may obtain voltage values of $V_{dd}$ and $V_{ss}$.

Figure 2:
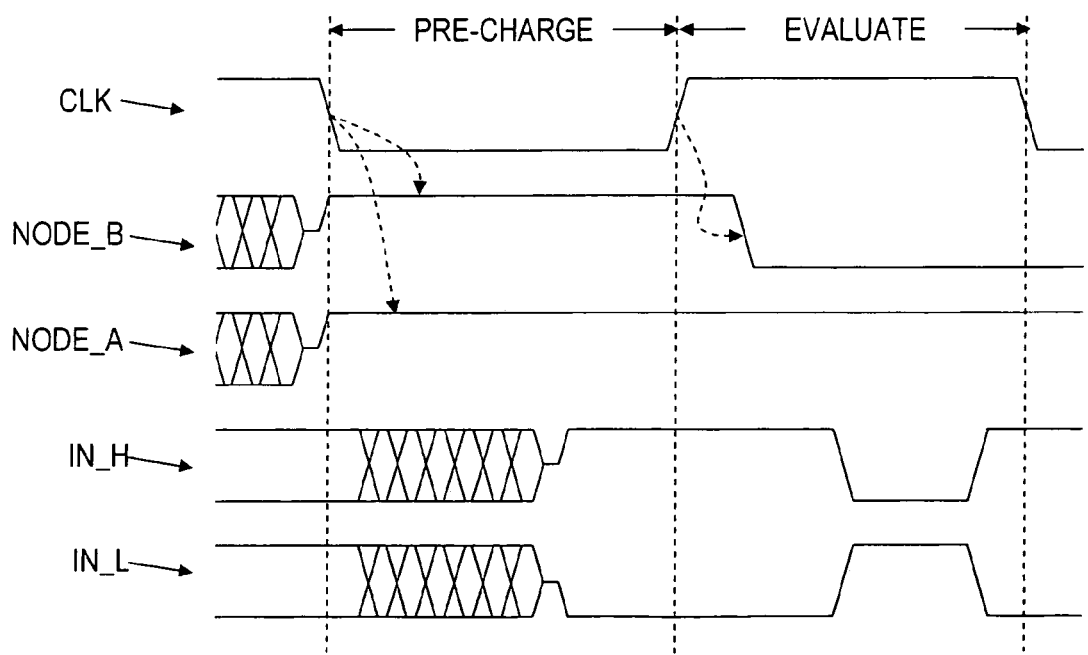
FIG. 2 illustrates an exemplary timing diagram for the various nodes.

Since circuit 2 has the ability to retain the states of C_H and C_L, circuit 2 may be used as a memory storage element, for example, circuit 2 may be part of a larger integrated circuit that contains an array of memory elements. Circuit 2 has two distinct phases, the pre-charge phase and the evaluation phase. FIG. 2 illustrates the relationship among the various signals. As illustrated in FIG. 2, the CLK node in circuit 2 undergoes the pre-charge phase and the evaluate phase. The pre-charge phase involves assigning predetermined values to NODE_A and NODE_B prior to storing data in circuit 2. During the pre-charge phase, CLK equals a low voltage, such as $V_{ss}$, and as a result, transistor 7 is OFF and transistors 16 and 22 are ON. Since NODE_A is coupled to the drain of transistor 16 and $V_{dd}$ is coupled to the source of transistor 16, NODE_A is pre-charged to $V_{dd}$ as illustrated in FIG. 2. Similarly, NODE_B is pre-charged to $V_{dd}$ due to the connection of transistor 22. In this manner, NODE_A and NODE_B may be assigned voltage values equal to $V_{dd}$ prior to circuit 2 being in the evaluate phase. Note that the status of other signals (e.g., IN_H and IN_L) during the pre-charge phase is insignificant since transistor 16 alone may provide the ability to pre-charge NODE_A to $V_{dd}$, and transistor 22 alone may provide the ability to pre-charge NODE_B to $V_{dd}$. Further, since transistor 7 is OFF during the pre-charge phase, NODE_A and NODE_B have no connection to $V_{ss}$ and are independent of the voltage states of IN_H and IN_L.

Referring still to FIG. 2, the evaluate phase of CLK involves establishing the desired storage value for circuit 2, whereas the pre-charge phase involves setting up the storage nodes for the evaluate phase. During the evaluate phase, CLK is high, and if IN_H is high during the evaluate phase then transistor 14 comes ON. Since NODE_A is high, transistor 21 is ON. In addition, with CLK high in the evaluate phase, transistor 7 is also ON, and NODE_B (i.e., the drain terminal of transistor 21) obtains a voltage value of $V_{ss}$ through the combination of transistors 7, 14, and 21 as illustrated in FIG. 2. Note that as NODE_B goes low, C_H will go high and keeper transistor 19 will turn on, creating a parallel path for NODE_B to obtain a voltage value of $V_{ss}$. Furthermore, as NODE_B obtains a voltage value of $V_{ss}$, transistor 23 turns on to maintain the pre-charged state of NODE_A at $V_{dd}$. With circuit 2 configured in this manner, subsequent changes in IN_H or IN_L will not affect the values of NODE_A or NODE_B until the circuit 2 is again pre-charged as illustrated.

During charge events, the digital state of various nodes within circuit 2 may be perturbed. Although each node in circuit 2 contributes to its overall operation, some nodes have a greater impact on the overall state. For example, since NODE_A and NODE_B couple to outputs C_H and C_L through inverters 4 and 5, perturbing the digital state of NODE_A or NODE_B will have a direct impact on the output of circuit 2. Thus, NODE_A and NODE_B have a greater impact on how susceptible circuit 2 is to soft errors.

Critical charge $Q_{critical}$ is the threshold amount of charge that needs to be injected during a charge event in order to corrupt a node's digital state. Once the amount of charge injected at a particular node exceeds that node's critical charge $Q_{critical}$, the node changes digital states. In circuit 2, the amount of charge required on NODE_A and NODE_B to corrupt their pre-charged states vary as CLK changes phases. (Note that although the following example involves NODE_A, the same principle applies to NODE_B.) For example, while CLK is changing phases from the pre-charge phase to the evaluate phase, NODE_A changes from its pre-charged value to a final value, and the critical charge $Q_{critical}$ required to change NODE_A's digital state decreases. However, once the value of NODE_A stabilizes the amount of critical charge $Q_{critical}$ required to alter NODE_A's digital state increases. Effectively, NODE_A becomes more susceptible to ionizing radiation at the beginning of the evaluate phase.

Embodiments of the present invention, such as circuit 2, help reduce the occurrence of soft errors. For example, referring back to FIG. 1, transistors 32 and 33 provide a path by which NODE_A maintains its pre-charged value of $V_{dd}$ while NODE_B is changing states. As illustrated in circuit 2, the gate of transistor 32 is coupled to IN_L and the gate of transistor 33 is coupled to the output C_L, which is the inverse of NODE_A. When NODE_B is changing states as illustrated in FIG. 2, the value of IN_L is low, which turns transistor 32 ON. Likewise, since NODE_A has been pre-charged to $V_{dd}$, output C_L is low, and transistor 33 is ON. In this manner, while NODE_B is changing states, NODE_A (which is coupled to the drain of transistor 33) is maintained at $V_{dd}$ by the combination of transistors 32 and 33. Accordingly, the number of soft errors that may occur at the beginning of the evaluate phase may be reduced because NODE_A is maintained at a pre-charged level of $V_{dd}$ while NODE_B is pulled low and changing states. Without this alternative path provided by transistors 32 and 33, NODE_A may be more susceptible to upsets by ionizing radiation.

Similarly, if NODE_A is the node that is changing states and actively pulled low, NODE_B is more susceptible to changing states as the result of a charge event, and transistors 30 and 31 provides functionality akin to transistors 32 and 33. That is, NODE_B is maintained at its pre-charged level of $V_{dd}$ while NODE_A is changing states. In addition to actively maintaining the pre-charged state of NODE_A and NODE_B, transistors 30, 31, 32, and 33 provide other features that aid in reducing number of soft errors. For example, the gate of transistor 33 is coupled to outputs C_L adding additional capacitance and therefore, the rate at which output C_L attains its final value is delayed. Thus, transistor 18, which couples to output C_L, is delayed in turning ON and as a result NODE_A (which is coupled to the drain of transistor 18) has a delayed reaction to any injected charge. This delayed reaction may be accomplished in other ways. For example, additional inverters may be added before or after inverters 4 and 5, where the outputs C_L and C_H represent the final output of the last inverter, and the rate at which C_H and C_L attain their final values may be delayed. Delaying the alternative path to $V_{ss}$ through transistors 18 for NODE_A, and through transistor 19 for NODE_B, may result in a lower soft error rate since the susceptibility to soft errors is highest when CLK goes from pre-charge to evaluate and any delay with respect to this edge results in a "hardening" of the circuit (i.e., lowering of the susceptibility to upset caused by ionizing radiation).

Storage type circuits akin to circuit 2 may be replicated many times on a single integrated circuit. Accordingly, individual transistors in circuit 2 are often kept as small as possible in order to conserve space. In this manner, the size of transistors 30, 31, 32, and 33 may be optimized for a desired level of reduction in soft error rate. For example, the number of soft errors may be reduced by fabricating transistors 30, 31, 32, and 33 larger than the minimum size enabled by the process, Thus, a circuit designer is able to chose between increasing circuit area and decreasing the soft error rate, or decreasing the circuit area and increasing the soft error rate.

Figure 3:
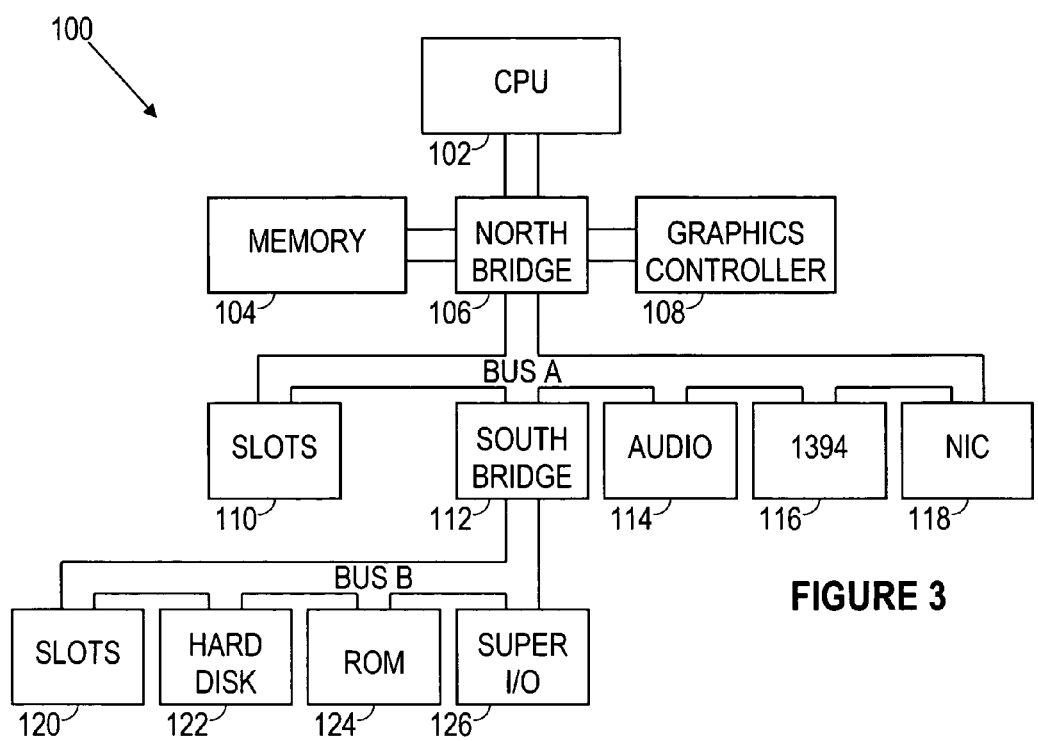
FIG. 3 is an exemplary computer system.

The storage circuits disclosed herein, and the methods for reducing the soft error rates may be used in a computer system. FIG. 3 illustrates an exemplary computer system 100. The computer system of FIG. 3 comprises a CPU 102 that couples to a bridge logic device 106 via a CPU bus. The bridge logic device 106 is sometimes referred to as a "North bridge." The North bridge 106 couples to a main memory array 104 by a memory bus, and may further couple to a graphics controller 108 via an advanced graphics processor ("AGP") bus. The North bridge 106 couples CPU 102, memory 104, and graphics controller 108 to the other peripheral devices in the system through, for example, a primary expansion bus ("BUS A") such as a peripheral component interconnect ("PCI") bus or an extended industry standard architecture ("EISA") bus. Various components that operate using the bus protocol of BUS A may reside on this bus, such as an audio device 114, an IEEE 1394 interface device 116, and a network interface card ("NIC") 118. These components may be integrated onto the motherboard, as suggested by FIG. 3, or they may be plugged into expansion slots 110 that are connected to BUS A.

If other secondary expansion buses are provided in the computer system, another bridge logic device 112 may be used to electrically couple the primary expansion bus ("BUS A") to the secondary expansion bus ("BUS B"). This bridge logic 112 is sometimes referred to as a "South bridge." Various components that operate using the bus protocol of BUS B may reside on this bus, such as a hard disk controller 122, a system read only memory ("ROM") 124, and Super input-output ("I/O") controller 126. Slots 120 may also be provided for plug-in components that comply with the protocol of BUS B. Any component in computer system 100 may implement the storage circuits disclosed herein. For example, the main memory array 104 may comprise storage circuits similar to circuit 2, which reduce the soft error rates. In this manner, the number of glitches in the system is kept at a minimum.

Numerous variations and modifications will become apparent to those skilled in the art once the above disclosure is fully appreciated. For example, other methods for maintaining the pre-charged values of NODE_A while NODE_B is changing states (or maintaining NODE_B while NODE_A is changing states) may be implemented. In addition, the voltage levels described herein are arbitrary such that the same functionality may be achieved using negative logic, for example, the evaluate phase may occur during CLK equal to a low value.

What is claimed is:

1. A method, comprising:
    assigning a plurality of nodes within a storage circuit to a predetermined state, while a clock signal is at a first level;
    evaluating a plurality of signals coupled to the storage circuit, when the clock signal is at a second level, wherein evaluating the plurality of signals enables a first node to change from its predetermined state; and
    actively maintaining a second node continuously in its predetermined state, from a time before the clock signal changes from the first level to the second level, until a time after the first node changes from its predetermined state.

2. The method of claim 1, wherein the second node is actively maintained in its predetermined state by one of the plurality of signals and the state of the second node.

3. The method of claim 1, further comprising:
    delaying, for a predetermined time after the clock signal changes to its second level, a signal that causes circuitry to actively maintain a node in a second state other than the predetermined state.

4. A storage circuit, comprising:
    a plurality of nodes including a first node and a second node, wherein the second node is coupled to the first node;
    the storage circuit receiving a plurality of signals, wherein the signals enable a first node to change from a predetermined state to a second state; and
    a circuit element coupled to the second node, wherein the circuit element actively maintains the second node at its predetermined state continuously from a time before the first node starts changing from its predetermined state until a time after the first node changes from its predetermined state.

5. The storage circuit of claim 4, wherein the circuit element coupled to the second node actively maintains the second node at its predetermined state in response to one of the plurality of signals and the state of the second node.

6. The storage circuit of claim 4, further comprising:
    a circuit element, coupled to the second node, that can actively maintain the second node in a second state, in response to a delayed signal from the second node.

7. The storage circuit of claim 6, wherein at least one transistor in the circuit element that maintains the second note at its predetermined state is larger than any transistor in the circuit element that can actively maintain the second node in a second state.

8. A computer system, comprising:
    a processor;
    a system memory coupled to said processor, wherein the memory further comprises:
        a plurality of nodes;
        a timing signal; and
        a plurality of control signals;
        wherein the timing signal and the control signals cause a first node within the plurality to change from an initialized state to a finalized state while a second node within the plurality is actively maintained in an initial state, continuously from a time before the timing signal causes the first node to start changing to its finalized state until a time after the first node changes to its finalized state.

9. The computer system of claim 8 wherein the second node is actively maintained in its initial state in response to one of the control signals and the state of the second node.

10. A method comprising:
    driving a plurality of nodes in a storage circuit to a precharge state when a clock signal is at a first level;
    driving a first node in the plurality of nodes to a second state, in response to a first input signal, when the clock signal changes from the first level to a second level; and
    driving a second node in the plurality of nodes to the precharge state by a second input signal and by a signal corresponding to the state of the second node.

* * * * *